(12) United States Patent
Hikita et al.

(10) Patent No.: US 6,376,915 B1
(45) Date of Patent: Apr. 23, 2002

(54) SEMICONDUCTOR DEVICE AND SEMICONDUCTOR CHIP

(75) Inventors: Junichi Hikita; Kazutaka Shibata; Shigeyuki Ueda, all of Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 09/512,337

(22) Filed: Feb. 24, 2000

(30) Foreign Application Priority Data

Feb. 26, 1999 (JP) .............................. 11-051211
Sep. 20, 1999 (JP) .............................. 11-265740

(51) Int. Cl.[7] ........................ H01L 23/48; H01L 23/52; H01L 29/40; H01L 21/44
(52) U.S. Cl. ..................... 257/777; 257/737; 257/778; 257/780; 257/723; 438/106; 438/108
(58) Field of Search ................. 257/737, 738, 257/777, 778, 780, 723, 712, 774; 438/127, 613, 106, 108

(56) References Cited

U.S. PATENT DOCUMENTS

| | | | | |
|---|---|---|---|---|
| 5,523,628 A | * | 6/1996 | Williams et al. | 257/777 |
| 5,569,960 A | * | 10/1996 | Kumazawa et al. | 257/738 |
| 5,633,535 A | * | 5/1997 | Chao et al. | 257/778 |
| 5,714,803 A | * | 2/1998 | Queyssac | 257/738 |
| 5,751,068 A | * | 5/1998 | McMahon et al. | 257/774 |
| 5,759,875 A | * | 6/1998 | Ahmad | 438/127 |
| 5,872,400 A | * | 2/1999 | Chapman et al. | 257/738 |
| 6,049,124 A | * | 4/2000 | Raiser et al. | 257/712 |
| 6,142,358 A | * | 11/2000 | Cohn et al. | 228/44.7 |
| 6,181,015 B1 | * | 1/2001 | Gotoh et al. | 257/778 |
| 6,184,062 B1 | * | 2/2001 | Brofman et al. | 438/106 |
| 6,201,301 B1 | * | 3/2001 | Hoang | 257/712 |
| 6,225,418 B1 | * | 5/2001 | Satsu et al. | 525/524 |
| 6,285,079 B1 | * | 9/2001 | Kunikiyo | 257/737 |
| 6,297,551 B1 | * | 10/2001 | Dudderar et al. | 257/723 |
| 6,313,528 B1 | * | 11/2001 | Solberg | 257/723 |

FOREIGN PATENT DOCUMENTS

| | | | |
|---|---|---|---|
| DE | 004226167 A1 | * | 2/1994 |
| JP | 59-202642 | | 11/1984 |
| JP | 61-259533 | | 11/1986 |
| JP | 404263433 A | * | 9/1992 |
| JP | 405013667 A | * | 1/1993 |
| JP | 405082582 A | * | 4/1993 |
| JP | 406236981 A | * | 8/1994 |

* cited by examiner

Primary Examiner—Matthew Smith
Assistant Examiner—Chuong A Luu
(74) Attorney, Agent, or Firm—Rader, Fishman & Grauer, PLLC

(57) ABSTRACT

A semiconductor device having a semiconductor chip bonded to the surface of a solid body (another semiconductor chip or wiring board). A hollow enclosed space surrounding a connection member is formed between the solid body surface and the surface of the semiconductor chip opposite thereto. The enclosed space may be formed by a surrounding wall disposed around the circumference of the semiconductor chip. The enclosed space may alternatively be formed by an encapsulating resin for packaging.

6 Claims, 3 Drawing Sheets

SEMICONDUCTOR DEVICE AND SEMICONDUCTOR CHIP

BACKGROUND OF THE INVENTION

1. Field of the Invention

The present invention relates to a semiconductor device having a flip chip bonding structure in which a semiconductor chip is bonded to a wiring board with the surface of the semiconductor chip being opposite thereto, and to a semiconductor device having a chip-on-chip structure in which a semiconductor chip is bonded to, as piled up on, the surface of another semiconductor chip. The present invention also relates to a semiconductor chip to be applied to any of the semiconductor devices above-mentioned.

2. Description of Related Art

As a method of improving the density of mounting semiconductor chips on a printed circuit board and of shortening the time required for mounting semiconductor chips, there has been known a so-called flip chip bonding (facedown bonding) in which each semiconductor chip is bonded to the surface of a printed circuit board or the like with the surface of each semiconductor chip facing the surface of the printed circuit board.

In this flip chip bonding structure, a plurality of bumps are disposed on the surface of a semiconductor chip. These bumps are bonded to electrodes disposed on the surface of a wiring board. This not only links the semiconductor chip and the wiring board to each other with a predetermined distance provided therebetween, but also electrically connects the semiconductor chip and the wiring board to each other. The space between the surface of the semiconductor chip and the surface of the wiring board is encapsulated with resin such that the semiconductor chip and the wiring board are housed in a package. This isolates the semiconductor chip from the outside air to prevent the semiconductor chip from being deteriorated in performance by the outside air moisture and the like.

If it is possible to eliminate the step of encapsulating the space between the semiconductor chip and the wiring board with resin, the semiconductor device producing time can be shortened to reduce the production cost of the semiconductor device.

Not only in a semiconductor device having a flip chip bonding structure, but also in a semiconductor device having a chip-on-chip structure in which a semiconductor chip is bonded to, as piled up on, the surface of another semiconductor chip, the space between the semiconductor chips is generally encapsulated with resin to prevent the semiconductor chips from being deteriorated in performance. Accordingly, if it is possible to eliminate the step of encapsulating the space between the semiconductor chips, this can shorten the time required for producing a semiconductor device having a chip-on-chip structure. This can lower the production cost of the semiconductor device.

An arrangement shown in FIG. 4 is adopted when encapsulating a semiconductor device having a chip-on-chip structure with resin. More specifically, one semiconductor chip 91 is bonded to another semiconductor chip 92 in a so-called facedown manner. A plurality of bumps 93 disposed between the semiconductor chips 91, 92, not only link the semiconductor chips 91, 92 to each other with a predetermined distance provided therebetween, but also electrically connect the semiconductor chips 91, 92 to each other. The space between the opposite surfaces of the semiconductor chips 91, 92 is encapsulated with resin 94 to produce a semiconductor module. The semiconductor module thus obtained by encapsulating the space between the semiconductor chips 91, 92 with the resin 94, is further encapsulated with a molding resin 96.

To mate the thermal expansion coefficient of the resin 94 encapsulating the space between the semiconductor chips 91, 92, with that of the semiconductor chips 91, 92, the resin 94 mixingly contains particles (filler) 95 such as silica or the like. This involves the likelihood that the surface protective layers formed at the uppermost surfaces of the semiconductor chips 91, 92 are damaged to deteriorate the performance thereof.

SUMMARY OF THE INVENTION

It is a first object of the present invention to provide a semiconductor device which can be produced without requiring resin-encapsulation of the space between a semiconductor chip and the surface of a solid body such as a wiring board or another semiconductor chip, and also to provide a semiconductor chip which can be applied to the semiconductor device above-mentioned.

It is another object of the present invention to provide a semiconductor device capable of preventing the surface of a semiconductor chip from being damaged.

The present invention provides a semiconductor device formed by bonding a semiconductor chip to the surface of a solid body, and this semiconductor device comprises: a connection member disposed between the solid body surface and that surface of the semiconductor chip opposite thereto for supporting the semiconductor chip with a predetermined distance provided between the semiconductor chip and the solid body surface and for electrically connecting the semiconductor chip and the solid body to each other; and an enclosing member which forms, between the solid body surface and that surface of the semiconductor chip opposite thereto, a hollow enclosed space surrounding the connection member.

The solid body surface may be the surface of another semiconductor chip or the surface of a wiring board (e.g., lead frame).

According to the present invention, the enclosing member encloses the space between the surface of the semiconductor chip and the surface of a solid body such as another semiconductor chip or a wiring board. This eliminates the danger of the outside air entering this space. It is therefore not required to encapsulate the space between the solid body and the semiconductor chip with resin to protect the semiconductor chip against the outside air. This shortens the time required for producing the semiconductor device, resulting in reduction in the production cost thereof.

Further, a hollow portion is formed between the surface of the solid body and the surface of the semiconductor chip housed in a package. Accordingly, the surface of the semiconductor chip faces the hollow portion to prevent the surface of the semiconductor chip from being damaged. This eliminates the danger of the semiconductor chip being deteriorated in performance due to damages on the surface thereof.

The space enclosed by the enclosing member may be filled with inert gas. Such an arrangement prevents the semiconductor chip from being deteriorated in performance.

The space enclosed by the enclosing member may be maintained substantially in a vacuum. Such an arrangement not only enhances the adhesion between the solid body surface and the semiconductor chip, but also successfully prevents the outside air from entering this space.

The enclosing member may be an enclosing wall disposed between the solid body surface and the semiconductor chip so as to surround the space there between. The enclosing wall preferably surrounds the connection member on the semiconductor chip surface. Where a plurality of connection members are provided on the surface of the semiconductor chip, all of them are preferably surrounded by the enclosing wall.

When an assembled body formed by bonding the semiconductor chip to the solid body surface with the surface of the semiconductor chip facing the solid body surface, is encapsulated by a resin package, the enclosing member may be an encapsulating resin serving as the material forming the resin package.

Mainly to mate the thermal expansion coefficient of the resin package with that of the semiconductor chip, the encapsulating resin serving as the material of the resin package, often mixingly contains filler particles. In such a case, the filler particle size is preferably greater than the distance between the solid body surface and the surface of the semiconductor chip. This prevents the filler from entering the space between the solid body surface and the surface of the semiconductor chip. This eliminates the danger of the semiconductor chip surface being damaged by the filler in the package material, thereby to further effectively prevent the semiconductor chip from being deteriorated in performance.

When the encapsulating resin mixingly contains a plurality of types of fillers, it is preferable that the particle size of each type of filler is larger than the distance between the solid body surface and the surface of the semiconductor chip and that a filler having a particle size smaller than this distance, is not mixingly contained in the encapsulating resin.

The present invention provides a semiconductor chip to be bonded to the surface of a solid body, and this semiconductor chip comprises: a connection member disposed on that surface of the semiconductor chip opposite to the solid body surface for supporting the semiconductor chip with a predetermined distance provided between the semiconductor chip and the solid body surface and for electrically connecting the semiconductor chip and the solid body to each other; and an enclosing wall disposed around all the circumference of the surface of the semiconductor chip opposite to the solid body surface, this enclosing wall being bonded to the solid body surface for enclosing the space between the surface of the semiconductor chip and the solid body surface.

These and other features, objects and advantages of the present invention will be more fully apparent from the following detailed description set forth below when taken in conjunction with the accompanying drawings.

DESCRIPTION OF THE PREFERRED EMBODIMENTS

Figure 1:
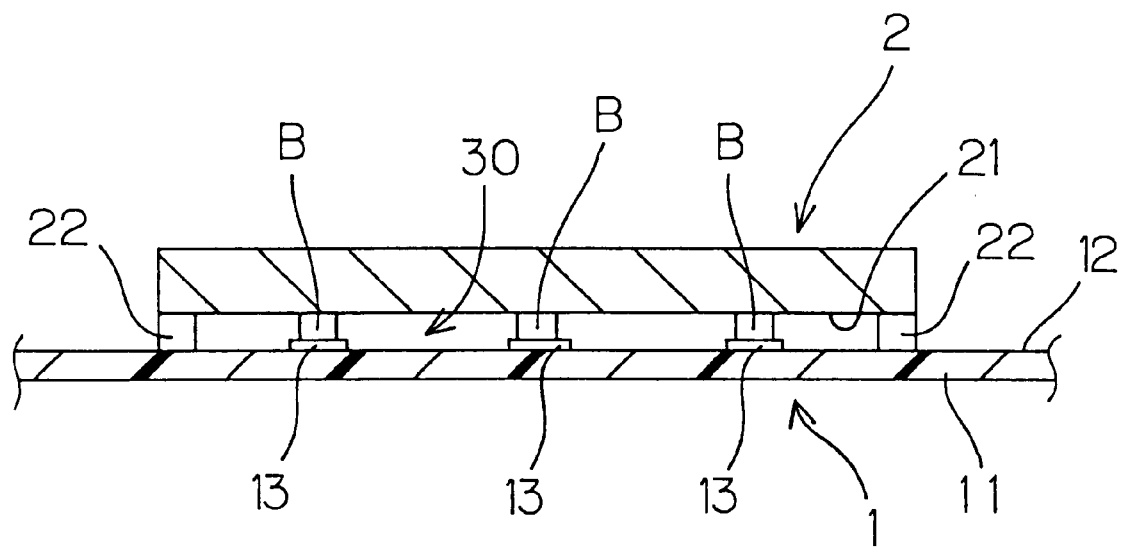
FIG. 1 is a schematic section view illustrating the arrangement of a semiconductor device according to a first embodiment of the present invention.
Figure 2:
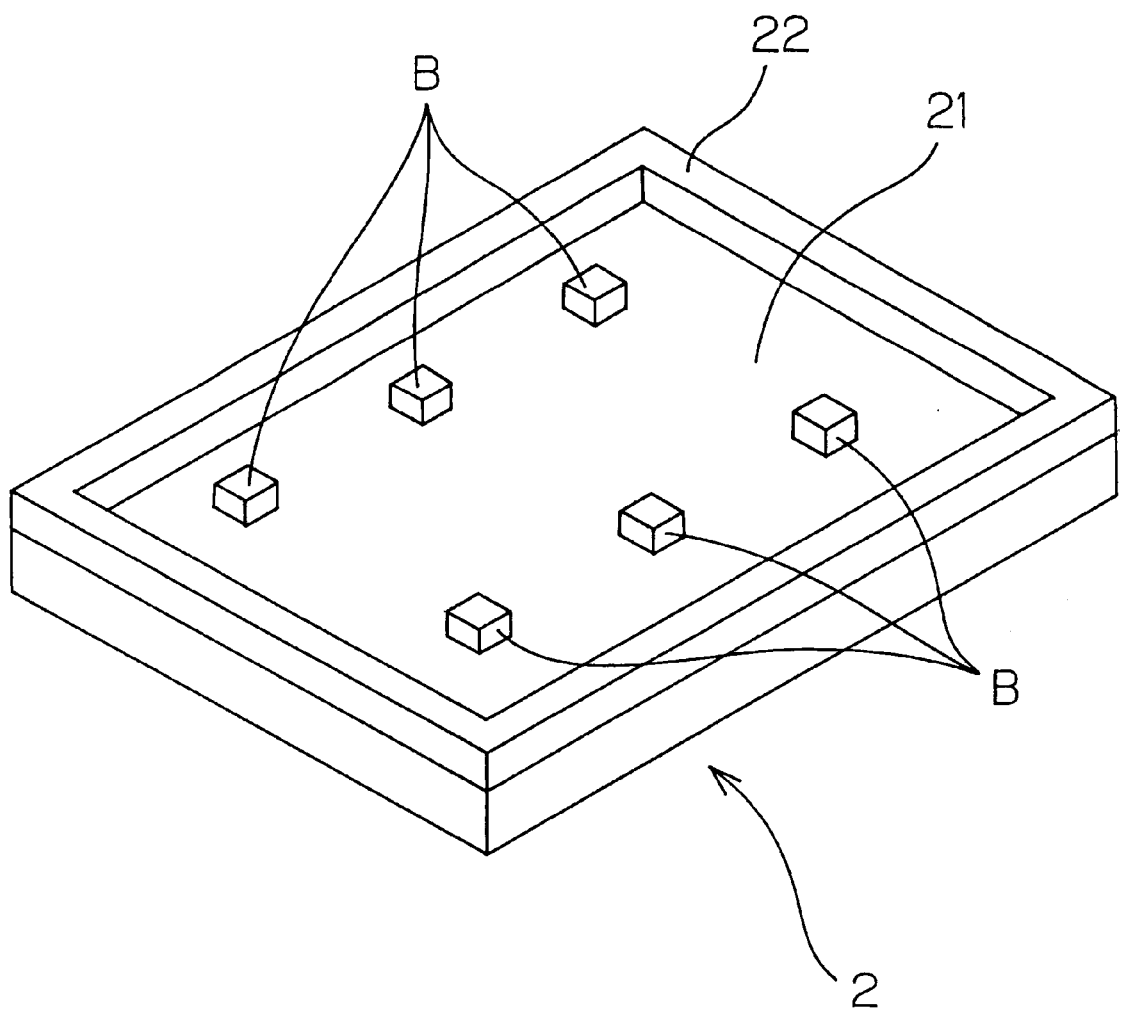
FIG. 2 is a perspective view of a semiconductor chip applied to the semiconductor device in FIG. 1.

FIG. 1 is a schematic section view illustrating the arrangement of a semiconductor device according to a first embodiment of the present invention, and FIG. 2 is a perspective view of a semiconductor chip applied to the semiconductor device in FIG. 1. This semiconductor device has a so-called flip chip bonding structure and comprises a wiring board 1 and a semiconductor chip 2 bonded to, as piled up on, the surface of the wiring board 1.

The wiring board 1 has a plate member 11 made of, for example, a synthetic resin, which has a surface 12 on which there are formed in pattern a plurality of electrodes 13 to be connected to the semiconductor chip 2, and a wiring layer (not shown) for connecting the electrodes 13 to one another.

The semiconductor chip 2 is formed by a silicon chip for example. The semiconductor chip 2 is bonded to the wiring board 1 in a so-called facedown manner in which the surface 21 of the semiconductor chip 2 faces the surface of the wiring board 1. The surface 21 of the semiconductor chip 2 is an active-layer-area-side surface of a semiconductor substrate serving as the base body of the semiconductor chip 2, functional elements such as transistors and the like being formed in this active-layer-area-side surface. The top of the surface 21 is coated with a protective layer having insulating properties. On this protective layer, there are projectingly formed conductive bumps B which are electrically connected to the inside circuit.

Formed around all the circumference of the semiconductor chip 2 is an enclosing wall portion 22 of which height is substantially equal to that of the bumps B. This enclosing wall portion 22 is made of a material identical with that of the bumps B, and can be formed simultaneously therewith.

The semiconductor chip 2 is mounted on the wiring board 1 in an atmosphere of inert gas such as nitrogen gas or argon gas. More specifically, with the bumps B respectively coming in contact with the electrodes 13 on the wiring board 1, the wiring board 1 and the semiconductor chip 2 are mutually contact-bonded to each other. The bumps B not only support the semiconductor chip 2 on the wiring board 1 with a predetermined distance provided therebetween, but also electrically connect the semiconductor chip 2 to the wiring layer. On the other hand, the enclosing wall portion 22 sticks to the surface 12 of the plate member 11 to enclose the space 30 between the wiring board 1 and the semiconductor chip 2. This isolates the space 30 between the wiring board 1 and the semiconductor chip 2, from the outside space, and the space 30 is maintained as filled with inert gas.

As discussed in the foregoing, the space 30 between the wiring board 1 and the semiconductor chip 2 is isolated from the outside by the enclosing wall portion 22. This eliminates the danger of the outside air entering the space 30. Further, the wiring board 1 is bonded to the semiconductor chip 2 in an atmosphere of inert gas, and the space 30 is filled with inert gas. This eliminates the danger of the semiconductor chip 2 being deteriorated in performance. Accordingly, the flip chip bonding structure using the semiconductor chip according to the first embodiment, requires no resin-encapsulation of the space between the wiring board 1 and the semiconductor chip 2. This can shorten the time required for producing the semiconductor device, resulting in reduction in the production cost thereof.

According to this embodiment, the bonding of the wiring board 1 to the semiconductor chip 2 is conducted in an atmosphere of inert gas, but may also be conducted in a vacuum. In such a case, a vacuum is formed in the space 30 between the wiring board 1 and the semiconductor chip 2. This enhances the adhesion between the wiring board 1 and the semiconductor chip 2.

In addition to a silicon chip, there may be used, as the semiconductor chip 2, a chip made of other optional semiconductor material such as a compound semiconductor (e.g., gallium-arsenic semiconductor), a germanium semiconductor or the like.

Further, this embodiment can be applied not only to a semiconductor device having a flip chip bonding structure, but also to a semiconductor device having a chip-on-chip structure in which a semiconductor chip is bonded to, as piled up on, the surface of another semiconductor chip.

Figure 3:
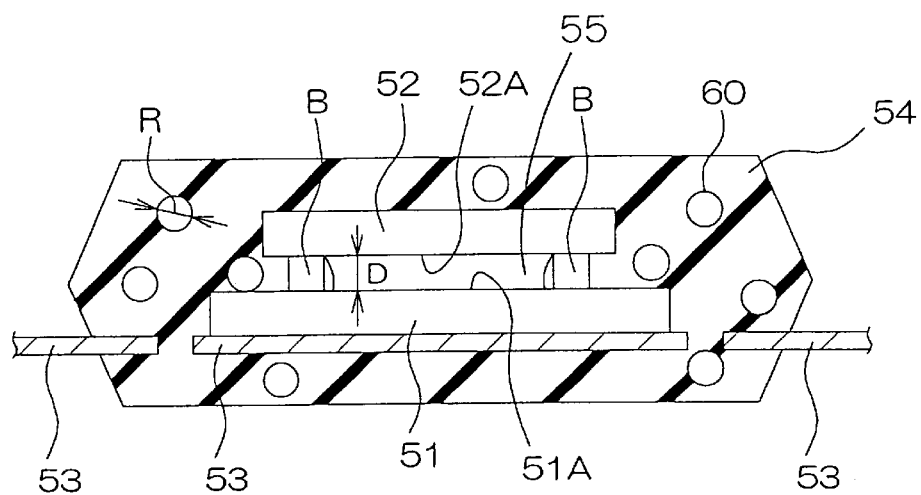
FIG. 3 is a schematic section view illustrating the arrangement of a semiconductor device according to a second embodiment of the present invention.
Figure 4:
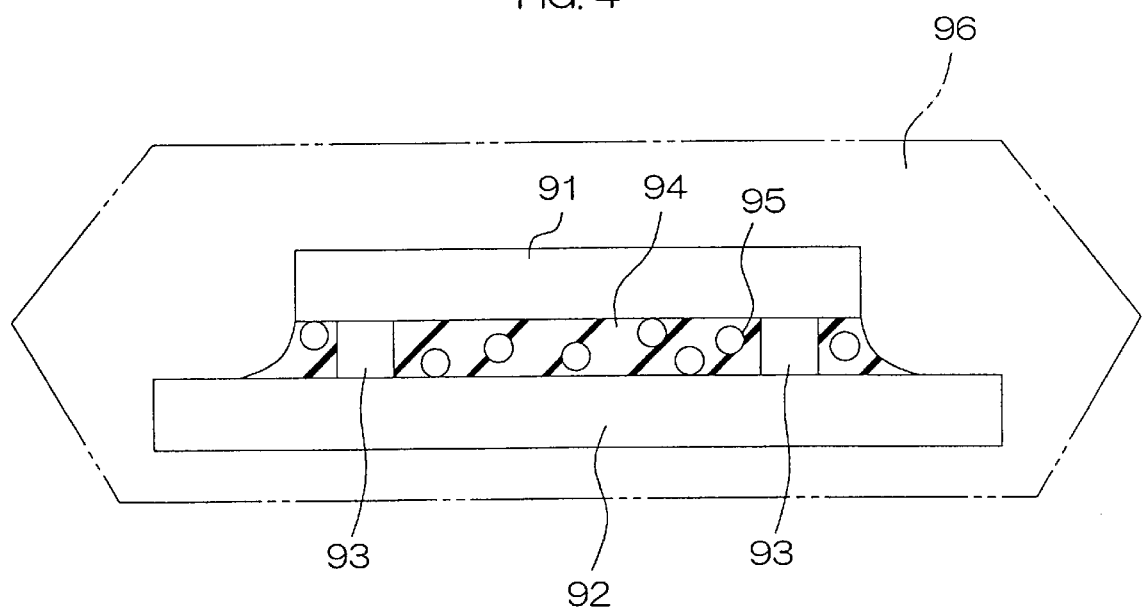
FIG. 4 is a schematic section view illustrating the problems of a semiconductor device in which the space between a primary chip and a secondary chip is encapsulated with resin.

FIG. 3 is a schematic section view illustrating the arrangement of a semiconductor device according to a second embodiment of the present invention. This semiconductor device has a so-called chip-on-chip structure in which a daughter chip or secondary chip 52 is bonded to, as piled up on, the surface 51A of a mother chip or primary chip 51.

The primary chip 51 is formed by a silicon chip for example. The surface 51A of the primary chip 51 is an active-layer-area-side surface of the semiconductor substrate, functional elements such as transistors and the like being formed in this active-layer-area-side surface. The top of the surface 51A is coated with a surface protective layer made of silicon nitride for example.

The secondary chip 52 is formed by a silicon chip for example. The surface 52A of the secondary chip 52 is an active-layer-area-side surface of the semiconductor substrate, functional elements such as transistors and the like being formed in this active-layer-area-side surface. The top of the surface 52A is coated with a surface protective layer made of silicon nitride for example. The secondary chip 52 is bonded to the primary chip 51 in a so-called facedown manner in which the surface 52A faces the surface 51A of the primary chip 51. A plurality of bumps B disposed between the primary chip 51 and the secondary chip 52, not only support the secondary chip 52 with a predetermined distance D provided between the surface 51A of the primary chip 51 and the secondary chip 52, but also electrically connect the secondary chip 52 to the primary chip 51.

The semiconductor module formed by bonding the primary chip 51 and the secondary chip 52 to each other, is bonded to a lead frame 53, and is then set in the cavity of a mold unit (not shown), and is then subjected to a resin encapsulation such that the semiconductor module is encapsulated in a package 54. At this resin encapsulation, the semiconductor module bonded to the lead frame 53 is set in the cavity of the mold unit disposed in an air atmosphere for example. Then, a resin material which will result in the package 54, is poured into the cavity. This resin material comprises a synthetic resin such as an epoxy resin or the like, and a filler 60 mixed therewith. The filler 60 is mixed to mate the thermal expansion coefficient of the resin material, with that of the primary chip 51 and the secondary chip 52. The filler 60 comprises silica particles for example. The particle size R of each silica particle is larger than the distance D between the primary chip 51 and the secondary chip 52. When the resin material contains a plurality of types of fillers, the particle size of each type of filler is larger than the distance D.

The resin material poured into the cavity covers the semiconductor module at its entire periphery, and tends to enter the space between the primary chip 51 and the secondary chip 52. However, the resin encapsulation is conducted in an air atmosphere. Thus, the air present between the primary chip 51 and the secondary chip 52 prevents the resin material from entering the space between the primary chip 51 and the secondary chip 52. As a result, the air remains in the space between the primary chip 51 and the secondary chip 52. With the air remaining in this manner, the resin material is hardened to form the package 54. Thus, there is completed a semiconductor device having a hollow portion 55 between the primary chip 51 and the secondary chip 52.

According to the second embodiment having the arrangement above-mentioned, the hollow portion 55 is formed between the primary chip 51 and the secondary chip 52 housed in the package 54, and the respective surfaces of the primary chip 51 and the secondary chip 52 face the hollow portion 55. In other words, the space between the primary chip 51 and the secondary chip 52 is not encapsulated with resin unlike in the arrangement of prior art. This does not involve the likelihood that the surface protective layers formed on the surfaces of the primary chip 51 and the secondary chip 52, are damaged by the filler contained in the resin. This eliminates the danger of the primary chip 51 and the secondary chip 52 being deteriorated in performance due to damages on their surface protective layers.

Further, the particle size R of the filler 60 in the resin material forming the package 54, is larger than the distance D between the primary chip 51 and the secondary chip 52. This prevents the filler 60 from entering the space between the primary chip 51 and the secondary chip 52. This eliminates the danger of the filler 60 damaging the surface protective layers formed on the surfaces of the primary chip 51 and the secondary chip 52.

According to the second embodiment, there is conducted, in an atmosphere of air, the step of resin-encapsulating the primary chip 51 and the secondary chip 52 in the package 54. However, this resin-encapsulating step may be conducted in a vacuum. In such a case, a vacuum is formed in the hollow portion 55 between the primary chip 51 and the secondary chip 52. This enhances the adhesion between the primary chip 51 and the secondary chip 52. Further, the resin-encapsulating step may also be conducted in an atmosphere of inert gas such as nitrogen gas or the like. In such a case, the hollow portion 55 between the primary chip 51 and the secondary chip 52 is filled with the inert gas. This further effectively prevents the primary chip 51 and the secondary chip 52 from being deteriorated in performance.

In the second embodiment, each of the primary chip 51 and the secondary chip 52 is made of silicon. In addition to such a silicon chip, there may be used a semiconductor chip made of other optional semiconductor material such as a compound semiconductor (e.g., gallium-arsenic semiconductor), a germanium semiconductor or the like. The semiconductor material of the primary chip 51 may be identical with or different from the semiconductor material of the secondary chip 52.

The chip-on-chip structure has been discussed in this second embodiment. However, the second embodiment may also be applied to a flip chip bonding structure in which a semiconductor chip is bonded to a wiring board such as a lead frame, with the surface of the semiconductor chip facing the wiring board.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application claims priority benefits under 35 USC § of Japanese Patent Application Serial No. 11-51211, filed on Feb. 26, 1999 and Japanese Patent Application Serial No. 11-65740, filed on Sep. 20, 1999, the disclosures of which incorporated herein by reference.

What we claim is:

1. A semiconductor device having a semiconductor chip bonded to a surface of a solid body, comprising:

a connection member disposed between the solid body surface and a surface of the semiconductor chip opposite thereof for supporting the semiconductor chip with a predetermined distance provided between the semiconductor chip and the solid body surface and for electrically connecting the semiconductor chip and the solid body to each other; and an enclosing member which forms, between the solid body surface and the surface of the semiconductor chip opposite thereto, a wall that surrounds a hollow enclosed space therebetween and the connection member in said enclosed space, wherein the wall formed from said enclosing member is made of the same material as the connection member.

2. A semiconductor device according to claim 1, wherein the space enclosed by the enclosing member is filled with inert gas.

3. A semiconductor device according to claim 1, wherein the space enclosed by the enclosing member is maintained substantially in a vacuum.

4. A semiconductor device having a semiconductor chip bonded to a surface of a solid body, comprising:

a connection member disposed between the solid body surface and a surface of the semiconductor chip opposite thereof for supporting the semiconductor chip with a predetermined distance provided between the semiconductor chip and the solid body surface and for electrically connecting the semiconductor chip and the solid body to each other;

an enclosing member which forms, between the solid body surface and the surface of the semiconductor chip opposite thereto, a hollow enclosed space surrounding the connection member; and a resin package for encapsulating an assembled body formed by bonding the semiconductor chip to the solid body surface with the surface of the semiconductor chip facing the solid body surface, the enclosing member being an encapsulating resin serving as a material forming the resin package, the encapsulating resin mixingly containing a filler having a particle size that is always greater than the distance between the solid body surface and the surface of the semiconductor chip.

5. A semiconductor chip to be bonded to a surface of a solid body, comprising:

a connection member disposed on a surface of the semiconductor chip opposite o the solid body surface for supporting the semiconductor chip with a predetermined distance provided between the semiconductor chip and the solid body surface and for electrically connecting the semiconductor chip and the solid body to each other; and an enclosing wall disposed around all the circumference of the surface of the semiconductor chip opposite to the solid body surface, the enclosing wall being made of the same material as the connection member, and bonded to the solid body surface for enclosing a space between the surface of the semiconductor chip and the solid body surface.

6. A semiconductor device according to claim 5, wherein the enclosing wall surrounds the connection member disposed on the surface of the semiconductor chip.

* * * * *